(12) United States Patent
Hama et al.

(10) Patent No.: US 7,843,124 B2
(45) Date of Patent: Nov. 30, 2010

(54) LIGHT EMITTING APPARATUS

(75) Inventors: Atsutomo Hama, Anan (JP); Yukihiro Hayashi, Tokushima (JP)

(73) Assignee: Nichiya Corporation, Anan (JP)

( * ) Notice: Subject to any disclaimer, the term of this patent is extended or adjusted under 35 U.S.C. 154(b) by 804 days.

(21) Appl. No.: 11/802,760

(22) Filed: May 24, 2007

(65) Prior Publication Data

US 2007/0279928 A1 Dec. 6, 2007

(30) Foreign Application Priority Data

May 30, 2006 (JP) .............................. 2006-150553

(51) Int. Cl.
*H05B 33/00* (2006.01)
*H01J 1/62* (2006.01)
(52) U.S. Cl. ...................................... 313/503; 313/512
(58) Field of Classification Search .......... 313/503–512
See application file for complete search history.

(56) References Cited

U.S. PATENT DOCUMENTS 3,550,095 A    12/1970  Kohashi ..................... 340/173
4,695,697 A     9/1987  Kosa ..................... 219/121 LZ
4,789,992 A    12/1988  Wickersheim et al. ...... 374/161

FOREIGN PATENT DOCUMENTS

| DE | 34 31 748 A1 | 3/1986 |
|----|---|---|
| EP | 0 063 068 A1 | 10/1982 |
| EP | 0 469 853 A2 | 2/1992 |
| FR | 2 693 559 A1 | 1/1994 |
| JP | 58-34887 A | 3/1983 |
| JP | 60-57808 A | 4/1985 |
| JP | 05-176208 A | 7/1993 |
| JP | 2003-515899 A | 5/2003 |
| WO | 01/40702 A1 | 6/2001 |

OTHER PUBLICATIONS

N. Narendran et al., "Solid-state lighting: failure analysis of white LEDs" Journal of Crystal Growth, vol. 268, pp. 449-456 (2004).

*Primary Examiner*—Joseph L Williams
(74) *Attorney, Agent, or Firm*—Kubovcik & Kubovcik

(57) ABSTRACT

The light emitting apparatus according to the present invention includes a light source; and an optical component including a fixed member having a through hole, and a wavelength conversion member having at least one part thereof arranged in the through hole, a cut-in part or a hole part being formed in a direction substantially perpendicular to the longitudinal direction of the through hole of the fixed member; where the light from the light source is guided to the wavelength conversion member.

17 Claims, 4 Drawing Sheets

LIGHT EMITTING APPARATUS

BACKGROUND OF THE INVENTION

1. Field of the Invention

The present invention relates to a light emitting apparatus equipped with an optical component including a wavelength conversion member for wavelength converting the light from a light source.

2. Description of the Related Art

Conventionally, a light source is proposed that transmits the light from the light source to a disperser via a separator such as an optical fiber to disperse the light into a desired pattern or change the color of the light (see Japanese Laid-Open Patent Publication No. 2003-515899).

A can package in which the semiconductor laser element is hermetically sealed is also known. The can package is hermetically sealed by a stem mounted with the semiconductor laser element and a cap having a constant thickness. A glass window for extracting the laser light is formed in the cap, and the glass is fixed to the inner side of the cap by way of resin adhesive.

SUMMARY OF THE INVENTION

However, the conventional light source merely has a disperser attached to the distal end of the separator such as an optical fiber, and thus the light emitting efficiency may not be satisfactory depending on the attaching method, and more improvement is required to be used as an optical component capable of being attached to the end part of the optical fiber.

As for the can package, the glass is fixed with resin adhesive, and thus organic components are volatilized from the resin adhesive. Such organic components become impurities and attach to the inside of the can package, in particular, to the glass and the exit end part of the semiconductor laser element, thereby lowering the optical output of the laser light.

It is, therefore, an object of the present invention to provide an optical component that has a simple configuration and that prevents lowering of the optical output.

According to the present invention, such aim is accomplished in the following manner.

The present invention relates to a light emitting apparatus including a light source; and an optical component including a fixed member having a through hole, and a wavelength conversion member having at least one part thereof arranged in the through hole, a cut-in part or a hole part being formed in a direction substantially perpendicular to the longitudinal direction of the through hole of the fixed member; where the light from the light source is guided to the wavelength conversion member. A configuration that is simple and that prevents lowering in optical output is thereby achieved.

The wavelength conversion member is preferably fixed to the fixed member using a fixing member. Therefore, the wavelength conversion member can be reliably fixed to the fixed member. Furthermore, hermetic sealing is realized.

The fixing member is preferably a low melting point glass. In particular, the low melting point glass having a softening point at lower than or equal to 650° C. is preferable. Degradation of the optical component can be thereby suppressed.

The fixing member is preferably filled in the cut-in part or the hole part formed in the fixed member when fixing the wavelength conversion member to the fixed member using the fixing member. Accordingly, the attachment of the wavelength conversion member to the fixed member is reliably performed with a small amount of fixing member, and thus lowering in optical output due to light absorption by the fixing member can be suppressed.

In addition to the above configuration, the fixed member may include a projection or a concave part for fitting the wavelength conversion member at the through hole side. When the fixed member has a projection on the through hole side, the wavelength conversion member preferably has a concave part that mates with the projection, or when the fixed member has a concave part on the through hole side, the wavelength conversion member preferably has a projection that fits into the concave part. With this configuration, the wavelength conversion member can be fixed even more reliably.

Preferably, the fixed member is a tubular body with its inner hole being circular in a transverse cross section. Chips and cracks of the fixed member can be thereby prevented.

The fixed member preferably includes a step at the through hole. The wavelength conversion member is thereby positioned at the step portion of the fixed member, and thus can always be arranged at a constant position.

The fixed member preferably has a diameter of at least one part of the through hole the same as or greater than a diameter of the wavelength conversion member. The detachment of the wavelength conversion member from the fixed member is thus less likely to occur.

The wavelength conversion member is preferably fitted in the through hole of the fixed member. The foreign substances are thus prevented from entering into the through hole.

The wavelength conversion member is preferably obtained by mixing a fluorescent material in glass. Degradation of the wavelength conversion member can be thereby prevented.

The wavelength conversion member preferably has a thickness of larger than or equal to 350 μm. The wavelength conversion member more preferably has a thickness of larger than or equal to 400 μm, and most preferably larger than or equal to 450 μm. The wavelength conversion efficiency can thereby be enhanced. The wavelength conversion member used in the present invention wavelength converts the light, and the wavelength conversion efficiency increases as the thickness of the wavelength conversion member becomes thicker, and thus the wavelength conversion member preferably has a thickness of larger than or equal to a predetermined thickness. This is different from the aim of the configuration to have a thinner thickness since the transmissivity of the light lowers when only glass is used as in the conventional can package.

The glass is preferably silicate glass. In particular, silicate glass containing one or more types of alkali metal oxide, alkali earth metal oxide, boron oxide, phosphorus oxide, zinc oxide is preferable. The resistance to weather of the wavelength conversion member thereby enhances, and degradation of the wavelength conversion member can be prevented.

The light source preferably emits light having a light emission peak within the wavelength region of 300 nm to 500 nm. A light source having high energy thus can be used in a visible light region.

The fixed member may adopt a configuration connected to a light guide for guiding the light from the light source. A configuration in which the light source and the wavelength conversion member are spaced apart so that heat from the light source is not directly transmitted can be achieved.

According to the present invention, an optical component that has a simple configuration and that prevents lowering of optical output is achieved.

DETAILED DESCRIPTION OF THE PREFERRED EMBODIMENTS

The preferred embodiments according to the present invention will now be described in detail with reference to the accompanying drawings.

Figure 1:
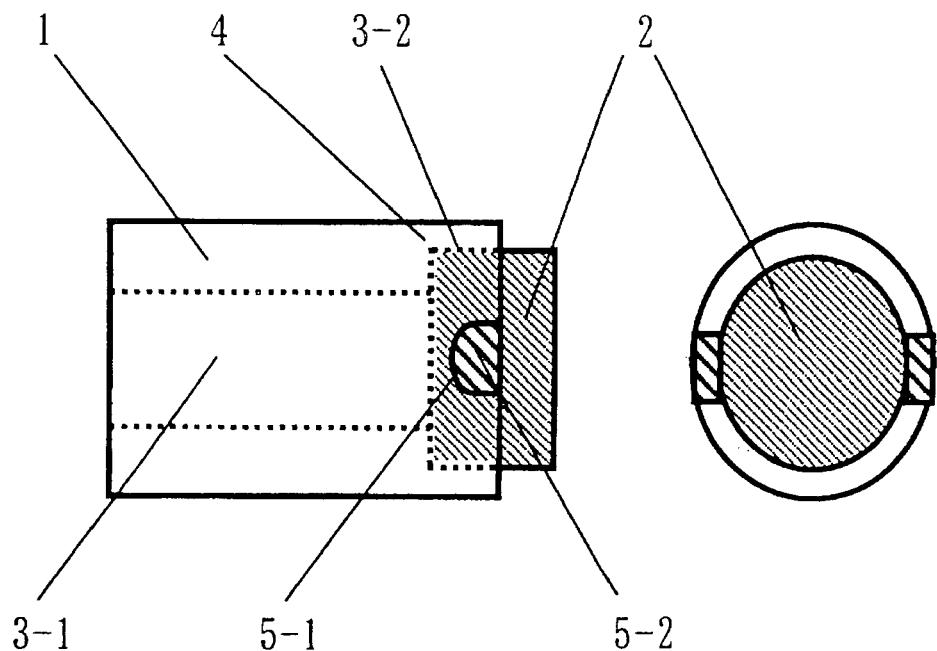
FIG. 1 is a view showing a configuration of an optical component according to a first embodiment used in a light emitting apparatus of the present invention.

FIG. 1 is a view showing a configuration of an optical component according to a first embodiment used in a light emitting apparatus of the present invention.

As shown in FIG. 1, the optical component according to the first embodiment includes a fixed member 1 and a wavelength conversion member 2. The fixed member 1 includes a fit-in part 3-2 in which the wavelength conversion member 2 is fitted, and a through hole 3-1 that contacts the fit-in part 3-2 with a step 4 in between. The outer shape of the fixed member 1 may be any shape such as circular, rectangular, and elliptical as long as it is a tubular body, but is preferably circular. The transverse cross sectional shape of an inner hole part of the tubular body, or the through hole 3-1 and the fit-in part 3-2, may be any shape such as circular, rectangular, and elliptical, but is preferably circular. The wavelength conversion member 2 may be of any shape such as column, quadratic prism, elliptic cylinder, sphere, hemisphere etc., but is preferably a column. The wavelength conversion member 2 is arranged in the fit-in part 3-2 of the fixed member 1, and is fixed to the fixed member 1 by filling a cut-in part 5-1 formed at the side surface of the fit-in part 3-2 with the fixing member 5-2. Any number of cut-in parts 5-1 may be formed, but is preferably equally arranged at the periphery of the wavelength conversion member 2.

The fixing method of the fixed member 1 and the wavelength conversion member 2 is that the wavelength conversion member 2 is fixed to the fixed member 1 by pushing the fixing member (low melting point glass) 5-2, which is molded so as to comply with the shape of the cut-in part in advance, onto the cut-in part 5-1 with the wavelength conversion member 2 arranged in the fit-in part 3-2 of the fixed member 1, and performing heating in this state to fill the fixing member 5-2 in the cut-in part 5-1.

The material of the fixed member 1 is preferably a material that has an anti-corrosion property and that easily adheres to the low melting point glass, and stainless material may be used.

According to the first embodiment, the attachment of the wavelength conversion member 2 to the fixed member 1 is reliably performed with the fixing member 5-2 of a smaller amount than in the attaching method (see FIG. 3) in which the low melting point glass is arranged on the side surface of the wavelength conversion member, and thus the affect of the fixing member 5-2 on properties such as light absorption is small. Therefore, according to the first embodiment, the light that exits from the wavelength conversion member 2 is discharged without being attenuated, thereby improving the light emitting efficiency.

Figure 2:
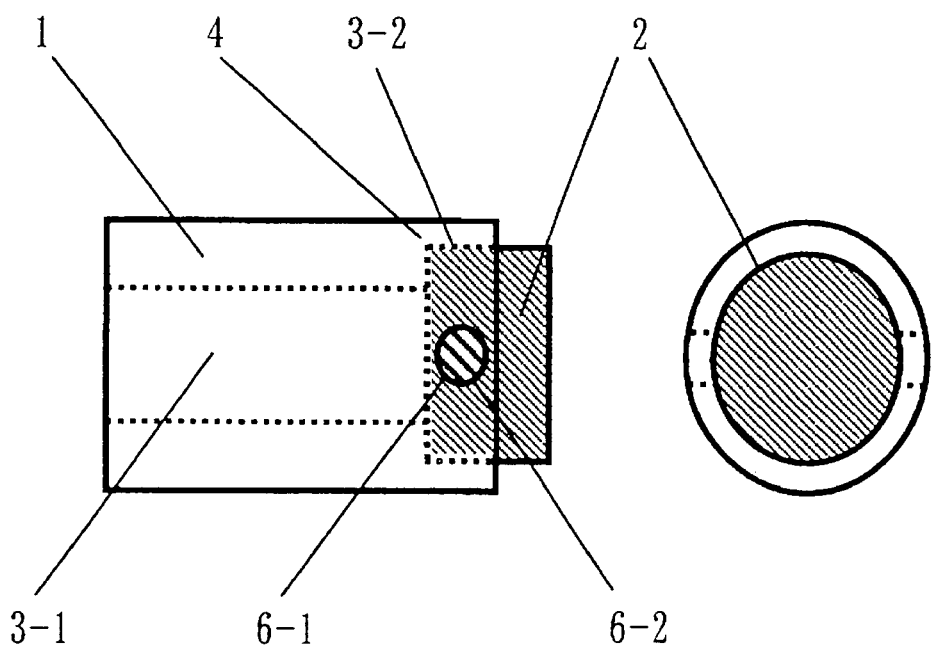
FIG. 2 is a view showing a configuration of an optical component according to a second embodiment used in the light emitting apparatus of the present invention.

FIG. 2 is a view showing a configuration of an optical component according to a second embodiment used in the light emitting apparatus of the present invention.

As shown in FIG. 2, the optical component according to the second embodiment includes a fixed member 1 and a wavelength conversion member 2. The fixed member 1 includes a fit-in part 3-2 in which the wavelength conversion member 2 is fitted, and a through hole 3-1 that contacts the fit-in part 3-2 with a step 4 in between. The outer shape of the fixed member 1 may be any shape such as circular, rectangular, and elliptical as long as it is a tubular body, but is preferably circular. The transverse cross sectional shape of an inner hole part of the tubular body, or the through hole 3-1 and the fit-in part 3-2, may be any shape such as circular, rectangular, and elliptical, but is preferably circular. The wavelength conversion member 2 may be of any shape such as column, quadratic prism, elliptic cylinder, sphere, and hemisphere, but is preferably a column. The wavelength conversion member 2 is arranged in the fit-in part 3-2 of the fixed member 1, and is fixed to the fixed member 1 by filling a hole part 6-1 formed at the side surface of the fit-in part 3-2 with the fixing member 6-2. Any number of hole parts 6-1 may be formed, but is preferably equally arranged at the periphery of the wavelength conversion member 2.

The fixing method of the fixed member 1 and the wavelength conversion member 2 is that the wavelength conversion member 2 is fixed to the fixed member 1 by filling the granulated low melting point glass 6-2 serving as the fixing member into the hole part 6-1 with the wavelength conversion member 2 arranged in the fit-in part 3-2 of the fixed member 1, and performing heating in this state.

According to the second embodiment, the attachment of the wavelength conversion member 2 to the fixed member 1 is reliably performed with a small amount of fixing member 6-2, and thus the affect of the fixing member 6-2 on properties such as light absorption is small. Therefore, according to the second embodiment, the light that exits from the wavelength conversion member 2 is discharged without being attenuated, thereby improving the light emitting efficiency.

Figure 3:
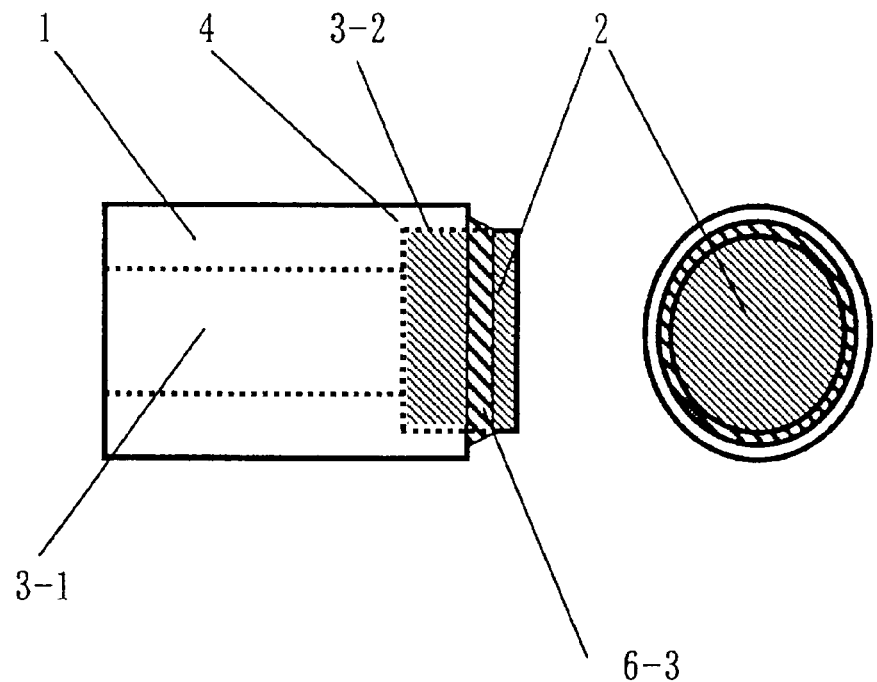
FIG. 3 is a view showing a configuration of an optical component of a comparative example in which a fixing member is arranged on the side surface of the waveform conversion member.

FIG. 3 is a view showing a configuration of an optical component of a comparative example through an attaching method in which the fixing member is arranged on the side surface of the wavelength conversion member.

As shown in FIG. 3, the optical component with the low melting point glass arranged on the side surface of the wavelength conversion member includes a fixed member 1 and a wavelength conversion member 2. The fixed member 1 includes a fit-in part 3-2 in which the wavelength conversion member 2 is fitted, and a through hole 3-1 that contacts the fit-in part 3-2 with a step 4 in between, but differs from the optical components shown in FIGS. 1 and 2 in that a cut-in part nor a hole part is formed at the side surface of the fit-in part 3-2. The fixed member 1 is a tubular body having a circular inner hole. The wavelength conversion member 2 has a columnar shape. The fixing method of the fixed member 1 and the wavelength conversion member 2 is that the wavelength conversion member 2 is fixed to the fixed member 1 by inserting the low melting point glass 6-3 molded into a ring shape in the wavelength conversion member 2 with the wavelength conversion member 2 arranged in the fit-in part 3-2 of the fixed member 1, and performing heating in this state.

In the optical component shown in FIG. 3, the fixed member 1 and the wavelength conversion member 2 cannot be fixed with a small amount of fixing member 6-3 since the cut-in part nor the hole part is formed at the side surface of the fit-in part 3-2 of the fixed member 1, and the fixing member 6-3 must be arranged around the entire periphery of the wavelength conversion member 2. Thus, the fixed portion of the fixed member 1 and the wavelength conversion member 2 has a shape in which the low melting point glass is arranged at the side surface of the wavelength conversion member. In this case, some of the light that exits from the wavelength conversion member 2 is absorbed by the fixing member 6-3 and shielded, whereby the light emitting efficiently lowers.

Figure 4:
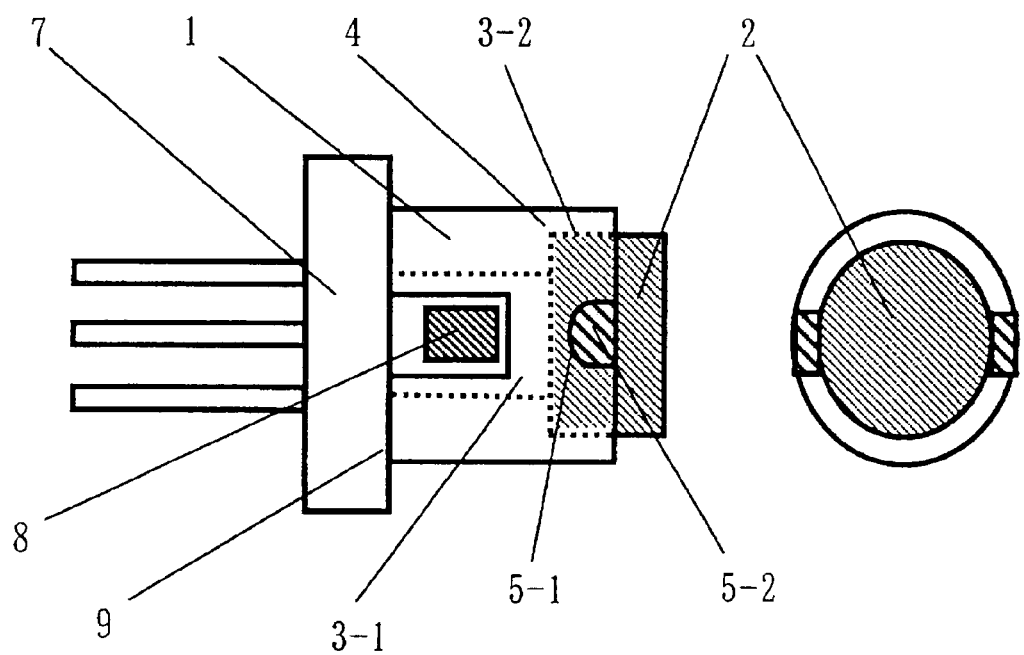
FIG. 4 is a view showing a configuration of a light emitting apparatus of the present invention equipped with an optical component according to the first embodiment.

FIG. 4 is a view showing a configuration of a light emitting apparatus of the present invention equipped with an optical component according to the first embodiment.

The light emitting device shown in FIG. 4 has a mounting platform 7 fixed to the through hole 3-1 side arranged opposite the fit-in part 3-2, which is fitted with the wavelength conversion member 2, of the fixed member 1 by way of a joining part 9. The fixing method includes weld fixation, fixing agent fixation, and brazing. A light source 8 is arranged on the mounting platform 7, and is arranged at a position where the light that exits from the light source 8 is efficiently guided to the wavelength conversion member.

The attachment of the wavelength conversion member 2 to the fixed member 1 is reliably performed with a small amount of fixing member 5-2, and thus none of the fixing member 5-2 goes around to the through hole 3-1 side, and properties such as light absorption will not be affected. Therefore, the light that exits from the light source 8 is guided to the wavelength conversion member 2 without being attenuated, and the light emitting efficiency can be improved. The light source 8 emits light having a light emission peak within the wavelength region of 300 nm to 500 nm, and a light emitting diode, a semiconductor laser element etc. is used as the light source.

Figure 5:
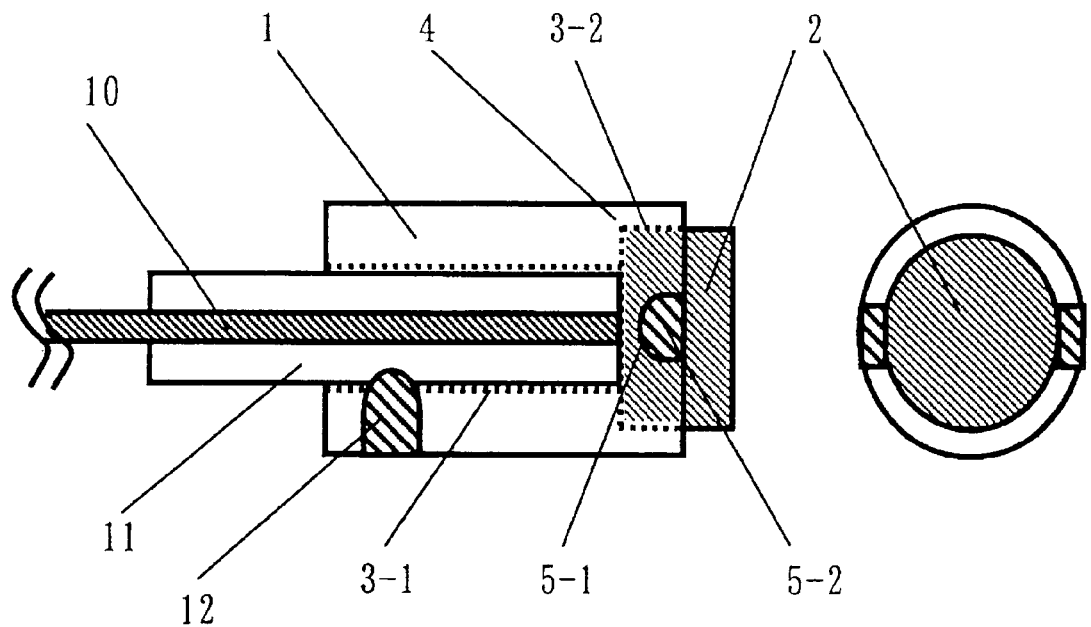
FIG. 5 is a view showing a configuration of a light emitting apparatus according to another embodiment of the present invention.

FIG. 5 is a view showing a configuration of another light emitting device equipped with the optical component according to the first embodiment of the present invention.

The light emitting device shown in FIG. 5 has a light guide holding member 11 arranged with a light guide 10 fixed to the through hole 3-1 side arranged opposite the fit-in part 3-2, which is fitted with the wavelength conversion member 2, of the fixed member 1 by way of a joining part 12 arranged on the side surface of the fixed member 1. The fixing method includes weld fixation and fixing agent fixation.

In weld fixation, the fixed member 1 and the light guide holding member 11 can be weld fixed through, e.g. YAG laser welding. In YAG laser welding, the YAG laser is irradiated onto the fixed member 1 to melt the fixed member 1, thereby weld fixing the fixed member 1 and the light guide holding member 11. Therefore, the portion weld fixed by the YAG welding becomes the joining part 12.

In fixing agent fixation, a hole is formed at the side surface of the fixed member 1 in advance, and after the light guide holding member 11 is inserted into the through hole 3-1, the fixing material is filled into the hole formed at the side surface of the fixed member 1, thereby fixing with fixing agent the fixed member 1 and the light guide holding member 11. Therefore, the portion fixed by the fixing material becomes the joining part 12.

The attachment of the wavelength conversion member 2 to the fixed member 1 is reliably performed with a small amount of fixing member 5-2, and thus none of the fixing member 5-2 goes around to the through hole 3-1 side, and the light guide 10 can be brought closer to the wavelength conversion member 2. Therefore, the light that exits from the light guide 10 is guided to the wavelength conversion member 2 without being attenuated, thereby improving the light emitting efficiency.

The glass used for the wavelength conversion member is preferably silicate glass. In particular, silicate glass containing one or more types of alkali metal oxide, alkali earth metal oxide, boron oxide, phosphorus oxide, zinc oxide is preferable. The wavelength conversion member is obtained by mixing fluorescent material powder and glass powder, and performing e.g. heat press molding on the mixed powder.

The fixing material is preferably the low melting point glass having a softening point at lower than or equal to 650° C.

EXAMPLE

Figure 6:
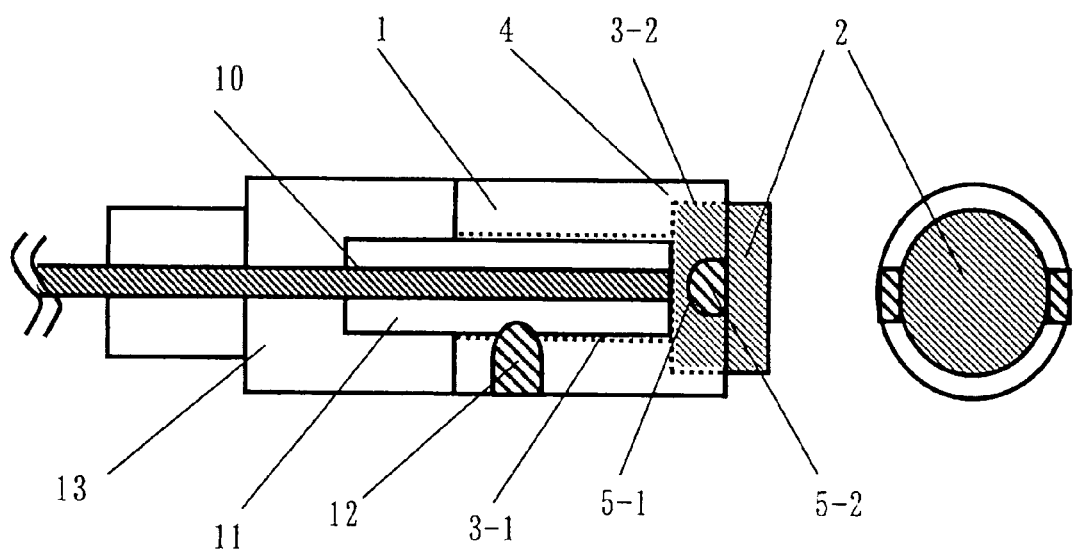
FIG. 6 is a view showing one part of a light emitting apparatus according to a first example of the present invention.

FIG. 6 is a. view showing one part of a light emitting apparatus according to a first example of the present invention.

In the first example, the transverse cross sectional shape of the fixed member 1, the through hole 3-1 and the fit-in part 3-2 is circular. The outer diameter of the fixed member 1 is 1.25 mm, the inner diameter of the through hole 3-1 is 0.7 mm, and the inner diameter of the fit-in part 3-2 is 0.9 mm. The depth of the fit-in part 3-2 is 0.1 mm, and the size of the cut-in part 5-1 is 0.2 mm in radius and 0.1 mm in depth and is arranged at two locations at opposite angles at the side surface of the fit-in part 3-2. The wavelength conversion member 2 also has a columnar shape having a diameter of 0.9 mm and a thickness of 0.45 mm. The wavelength conversion member 2 is fitted in the fit-in part 3-2, and is fixed by filling the fixing member 5-2 to the cut-in part 5-1. The material of the fixing member 5-2 used for fixing is the low melting point glass having a softening point at 520° C., and is filled by 0.07 mg. The light guide holding member 11 arranged with the light guide 10 is inserted into the through hole 3-1 of the fixed member 1, and is fixed by a fixing part 13. YAG laser welding is used for fixing.

Figure 7:
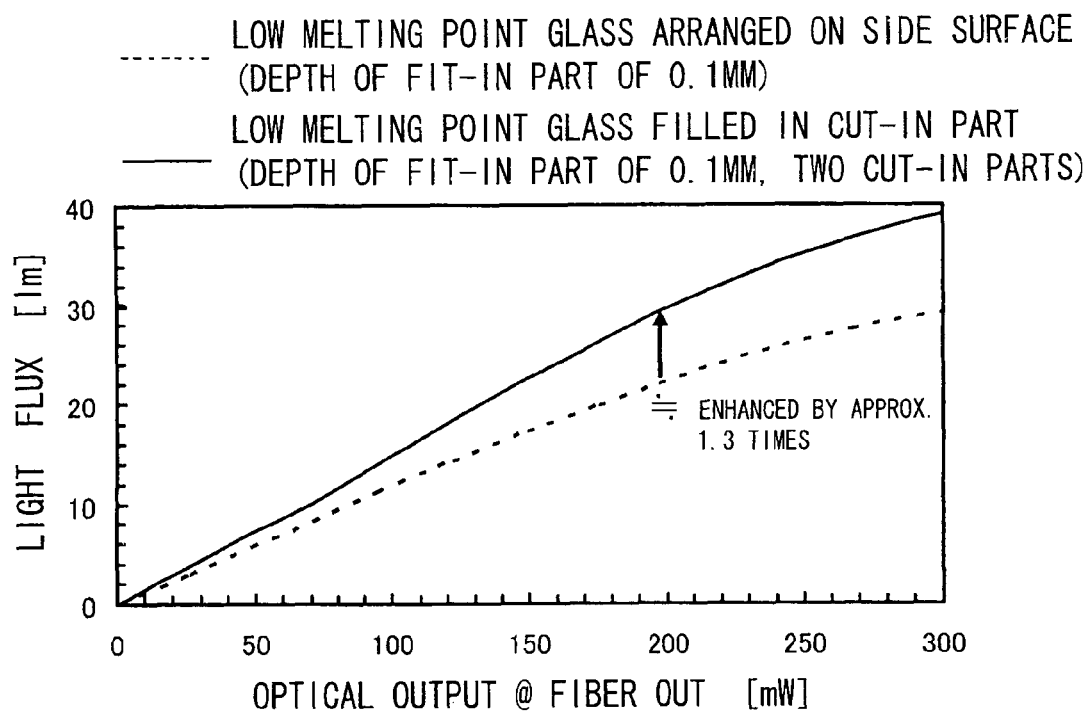
FIG. 7 is a view showing the effects of the first example of the present invention.

FIG. 7 shows the output characteristic of the light that exits from the wavelength conversion member 2 when the laser light of about 445 nm is entered from the incident side of the light guide 10. This is compared with the optical output characteristic of a sample having a shape in which the low melting point glass is arranged on the side surface of the wavelength conversion member as shown in FIG. 3 without using the present invention. As a result, the increase by approximately 1.3 times in light emitting efficiency is achieved by the present invention.

The present invention can be used in light emitting devices such as light emitting diode and semiconductor laser element.

What is claimed is:
1. A light emitting apparatus comprising;
a light source; and
an optical component including a fixed member having a through hole and a cut-in part or a hole part formed in a direction substantially perpendicular to the longitudinal direction of the through hole, and a wavelength conversion member having at least one part thereof arranged in said through hole;

wherein said wavelength conversion member is fixed to said fixed member using a fixing member, said fixing member being filled into said cut-in part or said hole part; and wherein the light from said light source is guided to said wavelength conversion member.

2. The light emitting apparatus according to claim 1, wherein said fixing member is low melting point glass.

3. The light emitting apparatus according to claim 1, wherein said fixed member is a tubular body and has an inner hole whose transverse cross sectional shape is circular shape.

4. The light emitting apparatus according to claim 3, wherein said fixed member includes a step at said through hole.

5. The light emitting apparatus according to claim 3, wherein a diameter of at least one part of said through hole in said fixed member is the same as or larger than a diameter of said wavelength conversion member.

6. The light emitting apparatus according to claim 3, wherein said wavelength conversion member is fitted in the through hole of said fixed member.

7. The light emitting apparatus according to claim 3, wherein said wavelength conversion member is obtained by mixing a fluorescent material in glass, 8. The light emitting apparatus according to claim 7, wherein said glass is silicate glass.

9. The light emitting apparatus according to claim 3, wherein said light source emits light having a light emission peak within the wavelength region of 300 nm to 500 nm.

10. The light emitting apparatus according to claim 3, wherein said fixed member is connected to a light guide for guiding the light from said light source.

11. The light emitting apparatus according to claim 1, wherein said fixed member includes a step at said through hole.

12. The light emitting apparatus according to claim 1, wherein a diameter of at least one part of said through hole in said fixed member is the same as or larger than a diameter of said wavelength conversion member.

13. The light emitting apparatus according to claim 1, wherein said wavelength conversion member is fitted in the through hole of said fixed member.

14. The light emitting apparatus according to claim 1, wherein said wavelength conversion member is obtained by mixing a fluorescent material in glass.

15. The light emitting apparatus according to claim 14, wherein said glass is silicate glass.

16. The light emitting apparatus according to claim 1, wherein said light source emits light having a light emission peak within the wavelength region of 300 nm to 500 nm.

17. The light emitting apparatus according to claim 1, wherein said fixed member is connected to a light guide for guiding the light from said light source.

* * * * *

UNITED STATES PATENT AND TRADEMARK OFFICE
CERTIFICATE OF CORRECTION

| | |
|---|---|
| PATENT NO. | : 7,843,124 B2 |
| APPLICATION NO. | : 11/802760 |
| DATED | : November 30, 2010 |
| INVENTOR(S) | : Atsutomo Hama and Yukihiro Hayashi |

It is certified that error appears in the above-identified patent and that said Letters Patent is hereby corrected as shown below:

On the Title page, item (73), "Nichiya Corporation" should be --Nichia Corporation--.

Signed and Sealed this
Twenty-second Day of May, 2012

David J. Kappos
*Director of the United States Patent and Trademark Office*